(12) United States Patent
Nakagawa et al.

(10) Patent No.: US 6,649,885 B2
(45) Date of Patent: Nov. 18, 2003

(54) THERMAL PROCESSING APPARATUS

(75) Inventors: Yoshiaki Nakagawa, Sanda (JP); Shizuka Tateishi, Kishima-gun (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 194 days.

(21) Appl. No.: 09/880,957

(22) Filed: Jun. 15, 2001

(65) Prior Publication Data

US 2001/0052517 A1 Dec. 20, 2001

(30) Foreign Application Priority Data

Jun. 15, 2000 (JP) .................................... 2000-179683

(51) Int. Cl.[7] .............................. H05B 1/02; F25B 3/30; C23C 16/00
(52) U.S. Cl. ........................ 219/502; 392/418; 118/724
(58) Field of Search ................................ 219/490, 497, 219/502, 444.1; 392/416, 418; 118/715, 716, 724, 725, 728, 729, 730; 438/795; 250/492.1, 492.2

(56) References Cited

U.S. PATENT DOCUMENTS

| | | | | | |
|---|---|---|---|---|---|
| 5,650,082 | A | * | 7/1997 | Anderson | 219/390 |
| 6,034,357 | A | * | 3/2000 | Guardado | 219/390 |
| 6,064,799 | A | * | 5/2000 | Anderson et al. | 392/416 |
| 6,130,415 | A | * | 10/2000 | Knoot | 219/502 |

* cited by examiner

Primary Examiner—Sang Y. Paik
(74) Attorney, Agent, or Firm—Wenderoth, Lind & Ponack, L.L.P.

(57) ABSTRACT

It is difficult to keep a wafer at a prescribed temperature in epitaxial growth and etching, leading to a possibility of variations in quality, but a thermal processing apparatus according to the present invention has a learning-modifying means in a controlling means to learn and modify an output $s_1$ from a radiation thermometer based on the output $s_1$ from the radiation thermometer, a supplied electric energy P to a heating means, and an output $s_2$ from a radiation thermometer.

12 Claims, 11 Drawing Sheets

Fig.11 (a) PRIOR ART
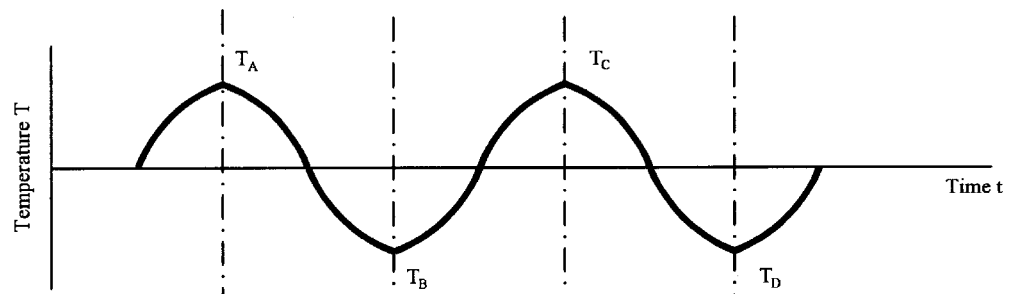
Fig.11 (b) PRIOR ART
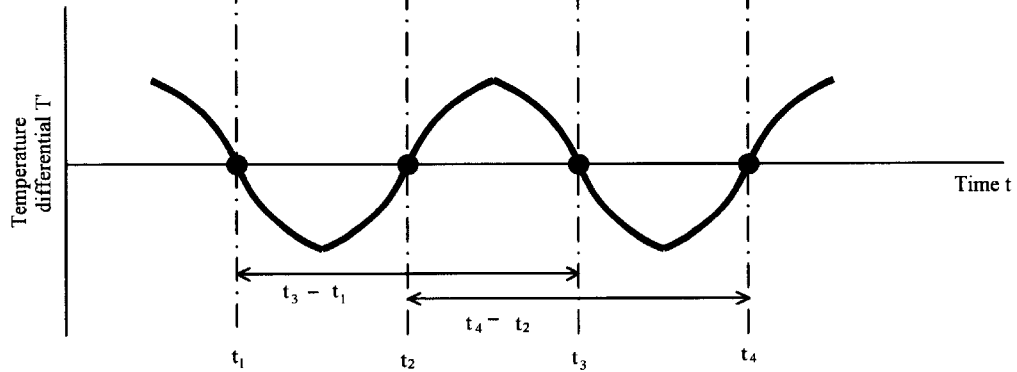

THERMAL PROCESSING APPARATUS

BACKGROUND OF THE INVENTION

1. Field of the Invention

The present invention relates to a thermal processing apparatus and, more particularly, to a thermal processing apparatus, for example, used for conducting epitaxial growth processing, etching, and the like on wafers.

2. Description of the Relevant Art

Hitherto, a radiation thermometer has been frequently used in a thermal processing apparatus for non-contact measurement of the surface temperature of a wafer or the like without scratching the wafer surface and contaminating the atmosphere within a chamber.

FIG. 7 is a diagrammatic sectional view of a conventional thermal processing apparatus of this type wherein a radiation thermometer is arranged, and in the figure, reference numeral 31a represents a vessel body which forms a chamber. The vessel body 31a is made of a material, such as quartz glass which transmits infrared rays, in the shape of an oval in a sectional view. At both ends of the vessel body 31a, an inlet 31b and an outlet 31c for a gas are formed, respectively. A prescribed gas 32 supplied from the inlet 31b passes through the vessel body 31a to reach a wafer 33 and is discharged from the outlet 31c. In a prescribed position inside the vessel body 31a, a susceptor 31d is arranged, which is rotated by a driving means (not shown). The wafer 33 in the shape of a disk as a workpiece is mounted on the susceptor 31d. An apparatus body 31 comprises the vessel body 31a, inlet 31b, outlet 31c, susceptor 31d, and associated parts.

Above and below outside the vessel body 31a, infrared lamps 34a and 34b as a heating means 34 are placed, respectively. These infrared lamps 34a and 34b are connected through wires 35a and 35b to a power supply means 35, respectively. The power supply means 35 is connected through a signal line 36b to a controlling means 36 which comprises a power supply controlling means 36a. On the other hand, in a prescribed position above the wafer 33 outside the vessel body 31a, a radiation thermometer 37 as a temperature measuring means is arranged, which is connected through a signal line 37a to the controlling means 36.

When a radiation light 33a emitted from the top of the wafer 33 penetrates the vessel body 31a (a transmission part 31e) to enter the radiation thermometer 37, a measured temperature $T_m$ of the top of the wafer 33 is obtained through the radiation thermometer 37 based on the brightness signal of the radiation light 33a, the emissivity of the wafer 33, and the like, and this signal $s_1$ is transmitted through the signal line 37a to the controlling means 36. A required electric energy P is computed based on the deviation of the measured temperature $T_m$ from a preset desired temperature $T_M$ by the power supply controlling means 36a in the controlling means 36, and this signal P is transmitted through the signal line 36b to the power supply means 35. Then, on the basis of the signal P, prescribed electric energies $P_1$ and $P_2$ (here, $P_1+P_2=P$) are distributed and supplied by the power supply means 35 through the wires 35a and 35b to the infrared lamps 34a and 34b, respectively. A thermal processing apparatus 30 comprises the apparatus body 31, heating means 34, power supply means 35, controlling means 36, radiation thermometer 37, and associated parts.

FIG. 8 is a graph indicating changes in the measured temperatures during the time when, after epitaxial growth processing is conducted on a total of seven wafers 33 one by one with the same heating pattern, using a conventional thermal processing apparatus 30 wherein a susceptor 31d (all in FIG. 7) is adjusted to be in a horizontal position, cleaning is conducted on a vessel body 31a (hereinafter, one process wherein, after thermal processing is successively conducted on a prescribed number of wafers 33 with the same operating conditions, vessel body cleaning is conducted, is referred to as one chance), and these steps are successively repeated. In the figure, X shows a measured temperature $T_m$ of the top of the wafer 33, while ○ shows a measured temperature $T_p$ of the bottom of the susceptor 31d measured using a thermocouple thermometer (not shown) separately arranged.

As is obvious from FIG. 8, the measured temperature $T_m$ of the top of the wafer 33 measured using a radiation thermometer 37 (FIG. 7) is kept about a prescribed value (about 1125° C.) at all times. On the other hand, the measured temperature $T_p$ of the bottom of the susceptor 31d measured using the thermocouple thermometer rises by degrees from about 1125° C. to about 1129° C. as the number of processed wafers 33 increases from 1 to 7. Then, the vessel body cleaning makes it back to the original temperature of about 1125° C. This means that the transmissivity of a radiation light 33a in the vicinity of a transmission part 31e (both in FIG. 7) gradually decreases every time one wafer 33 is processed, so that the temperature of the top of the wafer 33 becomes apparently lower. Therefore, extra power is supplied to a heating means 34 (FIG. 7) to keep the desired temperature (about 1125° C.), leading to a substantial rise in the temperature $T_p$ of the bottom of the susceptor 31d.

FIG. 9 is a graph indicating changes in the measured temperatures during the time when, after epitaxial growth processing is conducted on a total of seven wafers 33 one by one in a state where a prescribed electric energy P is regularly supplied to a heating means 34 as a test pattern, using a conventional thermal processing apparatus 30 wherein a susceptor 31d (all in FIG. 7) is adjusted to be in a horizontal position, cleaning is conducted on a vessel body 31a, and these steps are successively repeated. In the figure, X shows a measured temperature $T_m$ of the top of the wafer 33, while ○ shows a measured temperature $T_p$ of the bottom of the susceptor 31d measured using a thermocouple thermometer (not shown) separately arranged.

As is obvious from FIG. 9, the measured temperature $T_p$ of the bottom of the susceptor 31d measured using the thermocouple thermometer is kept about 1125° C. at all times. On the other hand, the measured temperature $T_m$ of the top of the wafer 33 measured using a radiation thermometer 37 (FIG. 7) falls by degrees from about 1125° C. to about 1118°° C. as the number of processed wafers 33 increases from 1 to 7. Then, the cleaning of the vessel body 31a makes it back to the original temperature of about 1125° C. This supports that the transmissivity of a radiation light 33a in a transmission part 31e (both in FIG. 7) gradually decreases every time one wafer 33 is processed, so that the measured temperature $T_m$ of the top of the wafer 33 becomes apparently lower.

FIG. 10 is a graph indicating changes in temperature when epitaxial growth processing is conducted on one wafer 33 with a prescribed heating pattern, using a conventional thermal processing apparatus 30 wherein the wafer 33 is mounted in a slightly tilted condition on a susceptor 31d (all in FIG. 7), being rotated. In the figure, (A) shows the desired temperature $T_M$, (B) shows the measured temperature $T_m$ of the top of the wafer 33, and (C) shows the measured temperature $T_p$ of the bottom of the susceptor 31d measured using a thermocouple thermometer (not shown) separately arranged.

As is obvious from FIG. 10, the measured temperature $T_m$ of the top of the wafer 33, the desired temperature $T_M$, and the measured temperature $T_p$ of the bottom of the susceptor 31d are not in agreement with one another, and the measured temperature $T_m$ of the top of the wafer 33 periodically repeats small fluctuations. The periodic fluctuations are in tune with the rotation period of the susceptor 31d. This means that the measured temperature $T_m$ measured using a radiation thermometer 37 is liable to periodically fluctuate because of the mirror surface of the wafer 33 when the wafer 33 is mounted not horizontally but in a slightly tilted condition.

As described above, in the above thermal processing apparatus 30, decomposed components from a gas 32 or the wafer 33 are liable to be deposited on the top of the wafer 33 or the inner wall of the vessel body 31a during the process of epitaxial growth processing or etching. Then, the vessel body 31a and the mirror-like top of the wafer 33 tarnish, so that the transmissivity of the vessel body 31a and the emissivity of the wafer 33 are likely to be lowered. Furthermore, the thickness of the deposit (not shown) and the deposited place tend to vary depending on the temperature of the inner wall of the vessel body 31a and the frequency of use thereof, the kind, flow velocity, and distribution channels of the gas 32, or the timing of removing the deposit (cleaning the vessel body 31a), so that it is difficult to accurately measure the temperature of the top of the wafer 33 at all times during the process of epitaxial growth processing or etching. When the susceptor 31d is rotated, the slight tilt of the wafer 33 makes it difficult to accurately measure the temperature of the top of the wafer 33, and it is difficult to accurately measure the temperature of the bottom of the rotating susceptor 31d using the thermocouple thermometer. As a result, it is difficult to supply an appropriate electric energy P to the heating means 34, so that it becomes difficult to make the temperature $T_m$ of the top of the wafer 33 closer to the desired temperature $T_M$, leading to a possibility that the quality of the wafer 33 after the epitaxial growth processing or etching becomes unstable.

SUMMARY OF THE INVENTION

The present invention was accomplished in order to solve the above problems, and it is an object of the present invention to provide a thermal processing apparatus, whereby the temperature of a wafer can be accurately measured at all times, so that epitaxial growth processing and etching can be conducted on the wafer while the wafer is kept at a prescribed temperature, resulting in the improvement in quality of the wafer as a semiconductor substrate.

In the case where an apparatus body 31 shown in FIG. 7 is used, when the rate of flow of a gas 32 running on the top side of a wafer 33 is set to be relatively larger than that running on the bottom side of a susceptor 31d, while a supplied electric energy $P_1$ to upper infrared lamps 34a is set to be relatively larger than that to lower infrared lamps 34b, the deposition of decomposed components onto the inner side surface of a vessel body 31a can be prevented comparatively well.

FIG. 11 is a partial enlarged curve fully showing a 2-cycle portion of the measured temperature $T_m$ of the top of the wafer shown in FIG. 10. As is obvious from FIG. 11, the measured temperatures $T_m$ of the top of the wafer 33 generated with the rotation of a susceptor 31d (both in FIG. 7) almost form a sine wave. Therefore, when a correction for eliminating the sine wave component is conducted, the temperature of the top of the wafer 33 can be accurately measured even if the wafer 33 is not mounted horizontally on the rotating susceptor 31d.

On the basis of the above knowledge, the present inventors completed the present invention as follows.

In order to achieve the above object, a thermal processing apparatus (1) according to the present invention is characterized by being a thermal processing apparatus comprising a heating means, a power supply means to supply electric power to the heating means, a controlling means to control a supplied electric energy to the heating means, and a first temperature measuring means to measure the temperature of a workpiece through a member which transmits infrared rays, wherein the controlling means comprises a learning-modifying means to learn and modify an output from the first temperature measuring means based on the output from the first temperature measuring means, a supplied electric energy to the heating means and/or an output from a second temperature measuring means separate from the first temperature measuring means.

Using the thermal processing apparatus (1), since the controlling means comprises a learning-modifying means to learn and modify an output from the first temperature measuring means based on the output from the first temperature measuring means, a supplied electric energy to the heating means and/or an output from a second temperature measuring means separate from the first temperature measuring means, the temperature of the workpiece can be accurately measured at all times even if a deposit adheres to the member, or the infrared ray transmission performance of the member deteriorates. Even when the workpiece is a wafer, epitaxial growth processing and etching can be reliably conducted thereon as the temperature thereof is kept at a desired temperature. As a result, the quality of the wafer as a semiconductor substrate can be improved.

A thermal processing apparatus (2) according to the present invention is characterized by being a thermal processing apparatus comprising a heating means, a power supply means to supply electric power to the heating means, a controlling means to control a supplied electric energy to the heating means, and a first temperature measuring means to measure the temperature of a workpiece through a member which transmits infrared rays, wherein the controlling means comprises a rotational component eliminating means to control so as to eliminate a periodically fluctuating signal component which appears in an output from the first temperature measuring means with the rotation of the workpiece.

Using the thermal processing apparatus (2), since the controlling means comprises a rotational component eliminating means to control so as to eliminate a periodically fluctuating signal component which appears in an output from the first temperature measuring means with the rotation of the workpiece, the temperature of the workpiece can be accurately measured at all times even when the workpiece is rotated. As a result, almost the same effect as in the case of the thermal processing apparatus (1) can be obtained.

A thermal processing apparatus (3) according to the present invention is characterized by being a thermal processing apparatus comprising a heating means, a power supply means to supply electric power to the heating means, a controlling means to control a supplied electric energy to the heating means, and a first temperature measuring means to measure the temperature of a workpiece through a member which transmits infrared rays, wherein the controlling means comprises both a learning-modifying means to learn and modify an output from the first temperature measuring means based on the output from the first temperature measuring means, a supplied electric energy to the heating means and/or an output from a second temperature measuring means separate from the first temperature measuring means, and a rotational component eliminating means to control so as to eliminate a periodically fluctuating signal component which appears in an output from the first temperature measuring means with the rotation of the workpiece.

Using the thermal processing apparatus (3), because of a synergistic effect of the effects which each of the thermal processing apparatus (1) and (2) has, a more excellent effect can be obtained.

A thermal processing apparatus (4) according to the present invention is characterized by the heating means, being arranged outside a member which transmits infrared rays, and being constituted so as to heat a workpiece using infrared rays in any of the thermal processing apparatus (1)–(3).

Using the thermal processing apparatus (4), the contamination of the workpiece caused by the heating means can be reliably prevented, so that high quality of the workpiece after thermal processing can be ensured.

BRIEF DESCRIPTION OF THE DRAWINGS

FIG. 11 is a partial enlarged curve showing a 2-cycle portion of the measured temperature of the top of the wafer (B) shown in FIG. 10, wherein (a) shows a sine wave of the temperature T-time t and (b) shows a cosine wave of the temperature differential T'-time t.

DETAILED DESCRIPTION OF THE PREFERRED EMBODIMENTS

The preferred embodiment of the thermal processing apparatus according to the present invention is described below by reference to the Figures of drawings. Here, the same marks are affixed to the compositions having the same functions as those in a conventional example.

Figure 1:
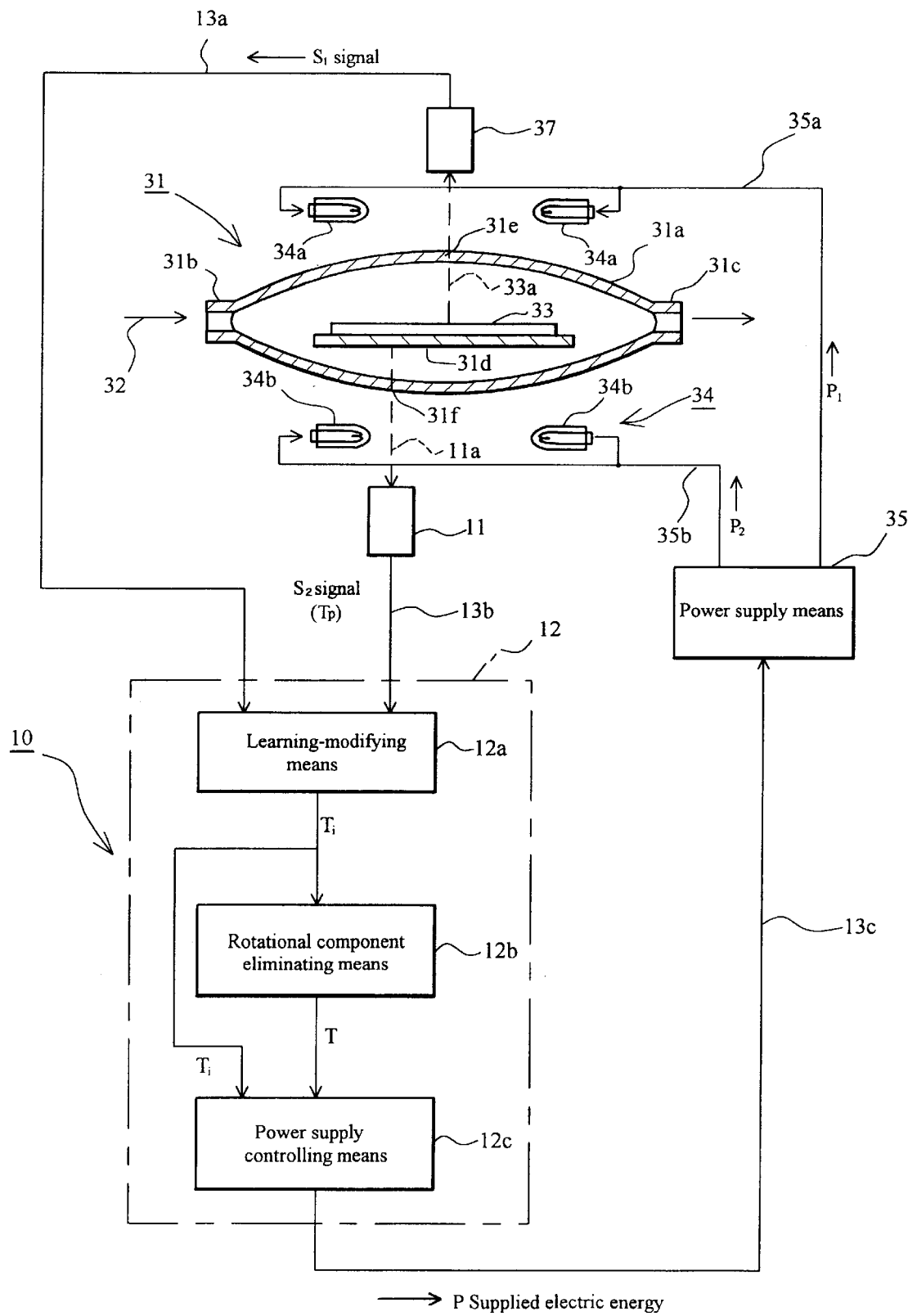
FIG. 1 is a diagrammatic sectional view showing a thermal processing apparatus according to an embodiment of the present invention.
Figure 7:
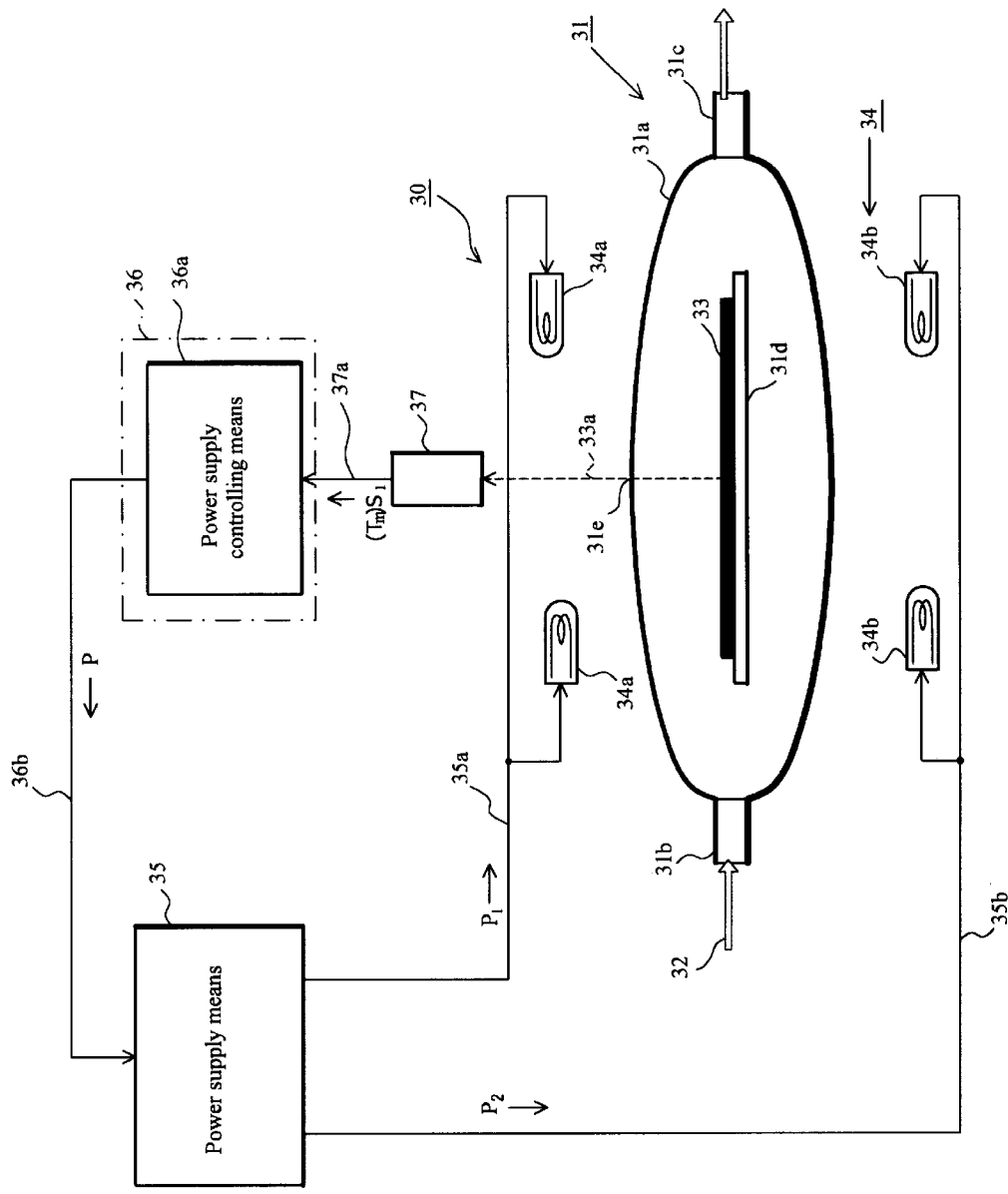
FIG. 7 is a diagrammatic sectional view showing a conventional thermal processing apparatus wherein a radiation thermometer is arranged.
Figure 8:
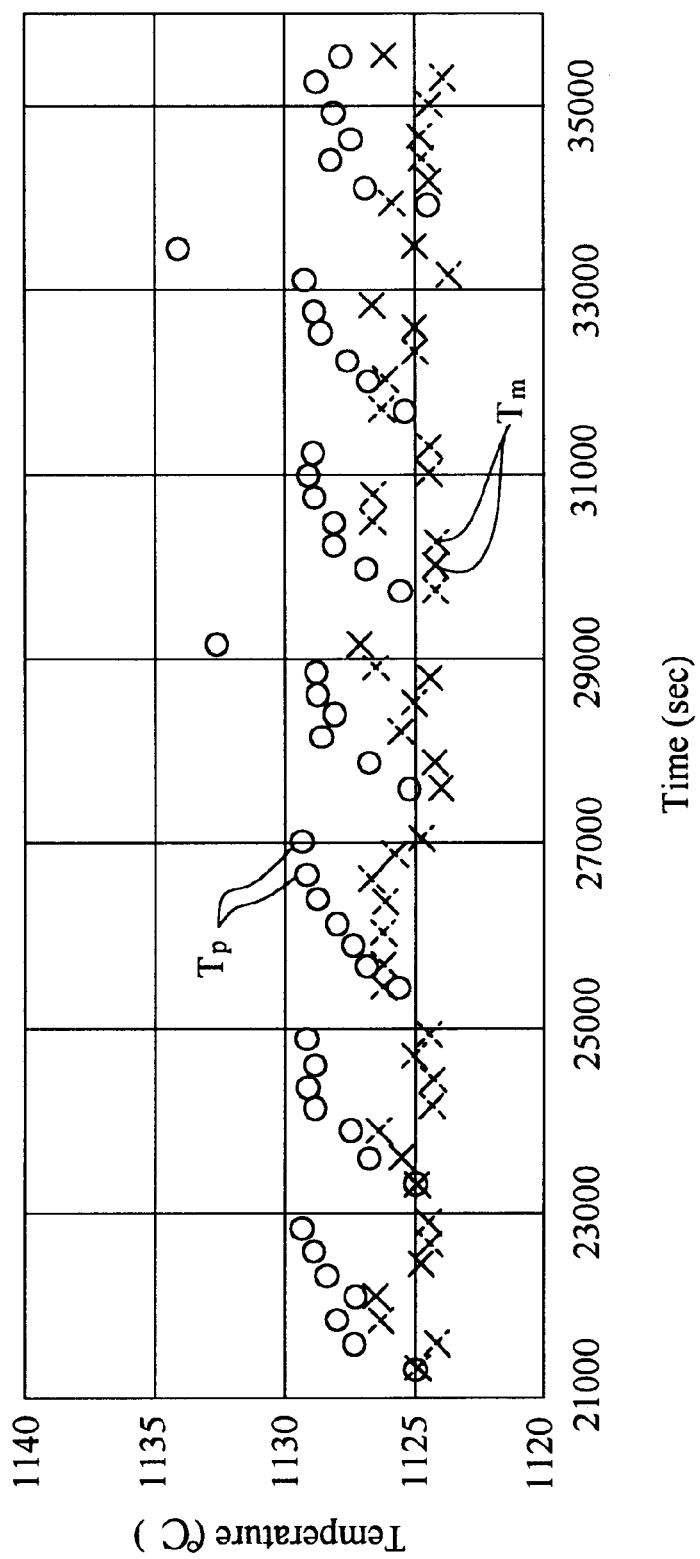
FIG. 8 is a graph indicating changes in the measured temperatures during the time when, after epitaxial growth processing is conducted on a total of seven wafers one by one with the same heating pattern, using a conventional thermal processing apparatus wherein a susceptor is not rotated, vessel body cleaning is conducted, and these steps are successively repeated. In the figure, X shows a measured temperature of the top of the wafer, while ○ shows a measured temperature of the bottom of the susceptor measured using a thermocouple thermometer separately arranged.
Figure 9:
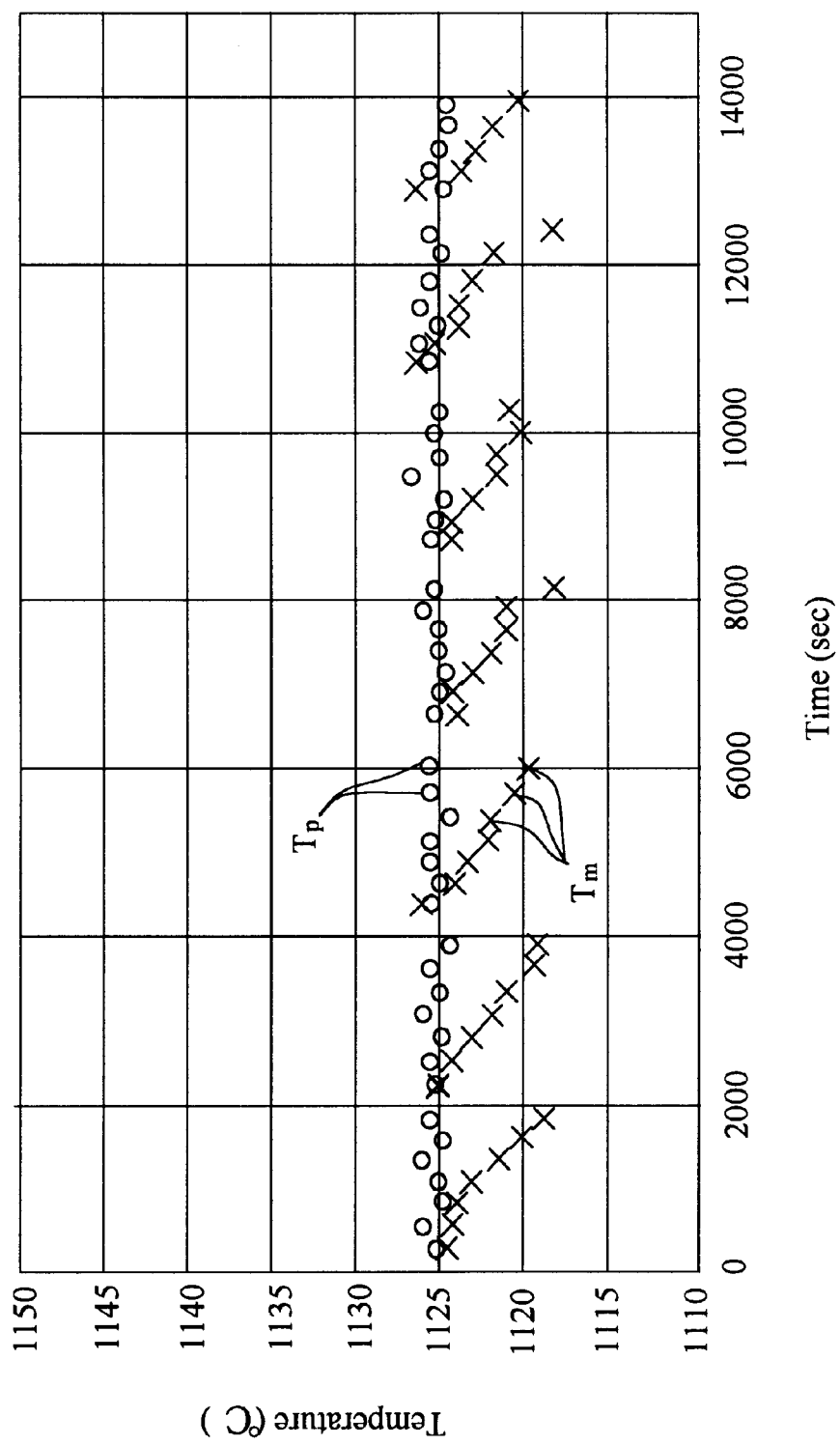
FIG. 9 is a graph indicating changes in the measured temperatures during the time when, after epitaxial growth processing is conducted on a total of seven wafers one by one in a state where a prescribed electric energy is regularly supplied as a test pattern, using a conventional thermal processing apparatus wherein a susceptor is not rotated, vessel body cleaning is conducted, and these steps are successively repeated. In the figure, x shows a measured temperature of the top of the wafer, while ○ shows a measured temperature of the bottom of the susceptor measured using a thermocouple thermometer separately arranged.
Figure 10:
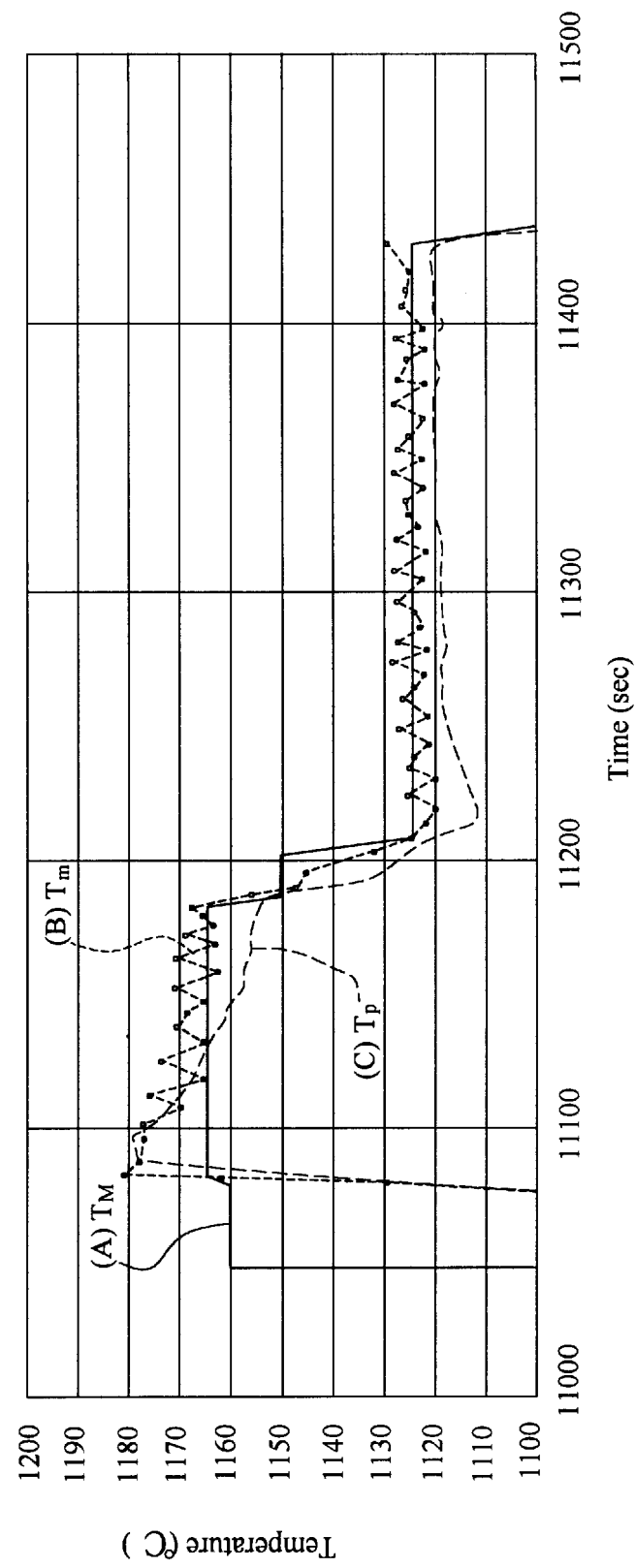
FIG. 10 is a graph indicating changes in temperature when epitaxial growth processing is conducted on a wafer with a prescribed heating pattern, using a conventional thermal processing apparatus wherein the wafer is mounted in a slightly tilted condition on a susceptor, being rotated. In the figure, (A) shows the desired temperature, (B) shows the measured temperature of the top of the wafer, and (C) shows the measured temperature of the bottom of the susceptor measured using a thermocouple thermometer separately arranged.

FIG. 1 is a block diagram schematically showing a thermal processing apparatus according to an embodiment, and in the figure, reference numerals 31, 34, 35, and 37 represent the same apparatus body, heating means, power supply means, and radiation thermometer as those shown in FIG. 7, respectively. The radiation thermometer 37 as a first temperature measuring means is connected through a signal line 13a to a learning-modifying means 12a. On the other hand, in a prescribed position below a susceptor 31d within the apparatus body 31, a radiation thermometer 11 as a second temperature measuring means is arranged, which is connected through a signal line 13b to the learning-modifying means 12a. The learning-modifying means 12a is connected to a rotational component eliminating means 12b, which is connected to a power supply controlling means 12c. A controlling means 12 comprises these learning-modifying means 12a, rotational component eliminating means 12b, power supply controlling means 12c, and associated parts. In memory (not shown) of the controlling means 12, the below-described Equations 1–3, selected values such as factors $k_1$, $k_2$, $\beta$, and $\gamma$, and the like are stored. The power supply controlling means 12c is connected through a signal line 13c to the power supply means 35.

$$\Delta T_a(n+1)=\Delta T_a(n)+k_1\{(\beta \Delta T_p/N)-\Delta T_a(n)\}+k_2\{(\gamma \Delta P/N)-\Delta T_a(n)\} \quad \text{Eq. 1}$$

where $\Delta T_a$ (n+1): temperature correction value to each wafer at chance (n+1)

$\Delta T_a$ (n): actual temperature correction value to each wafer at chance n $\Delta T_p$: actual amount of change in measured temperature by the second temperature measuring means (at chance n)

$\Delta P$: actual amount of change in supplied electric energy at chance n

N: actual number of processed wafers at chance n $k_1, k_2$: obliteration factor, $k_1 \geq 0$, $k_2 \geq 0$, $(k_1+k_2) \leq 1$ $\beta, \gamma$: correction factor $$T_i = T_{mi} + \Delta T_a(n+1)_{(i-1)} \qquad \text{Eq. 2}$$

where $T_i$: controlled temperature of ith wafer at chance (n+1)

$T_{mi}$: actual measured temperature of ith wafer at chance n i: number of processed wafers in a chance $\Delta T_a$ (n+1)$_{(i-1)}$: temperature correction value to (i−1)th wafer at chance (n+1)

$$T = T_i - A\sin(\omega t - \alpha) \qquad \text{Eq. 3}$$

where T: controlled temperature $T_i$: controlled temperature of ith wafer at chance (n+1)

A: amplitude

ω: fluctuating angular frequency

α: phase t: time

When a radiation light 33a emitted from the top of a wafer 33 penetrates a vessel body 31a (a transmission part 31e) and enters the radiation thermometer 37, a measured temperature $T_{mi}$ of the top of the wafer 33 is obtained through the radiation thermometer 37 based on the brightness signal of the radiation light 33a, the emissivity of the wafer 33, and the like, and this signal $s_1$ is transmitted through the signal line 13a to the learning-modifying means 12a. On the other hand, a radiation light 11a emitted from the bottom of a susceptor 31d penetrates the vessel body 31a (a part 31f) and enters the radiation thermometer 11, a measured temperature $T_p$ of the bottom of the susceptor 31d is obtained through the radiation thermometer 11 based on the brightness signal of the radiation light 11a, the emissivity of the susceptor 31d, and the like, and this signal $s_2$ is transmitted through the signal line 13b to the controlling means 12. Then, by the controlling means 12, controlled temperatures T and $T_i$ of the top of the wafer 33 are computed based on the signals $s_1$ and $s_2$, Equations 1–5, and the like. Based on the deviation of the controlled temperature T or $T_i$ from a desired temperature $T_M$, a supplied electric energy P is computed. Since the other constructions are almost the same as those shown in FIG. 7, they are not described in detail here. A thermal processing apparatus 10 comprises these radiation thermometers 11 and 37, controlling means 12, apparatus body 31, heating means 34, power supply means 35, and associated parts.

Figure 2:
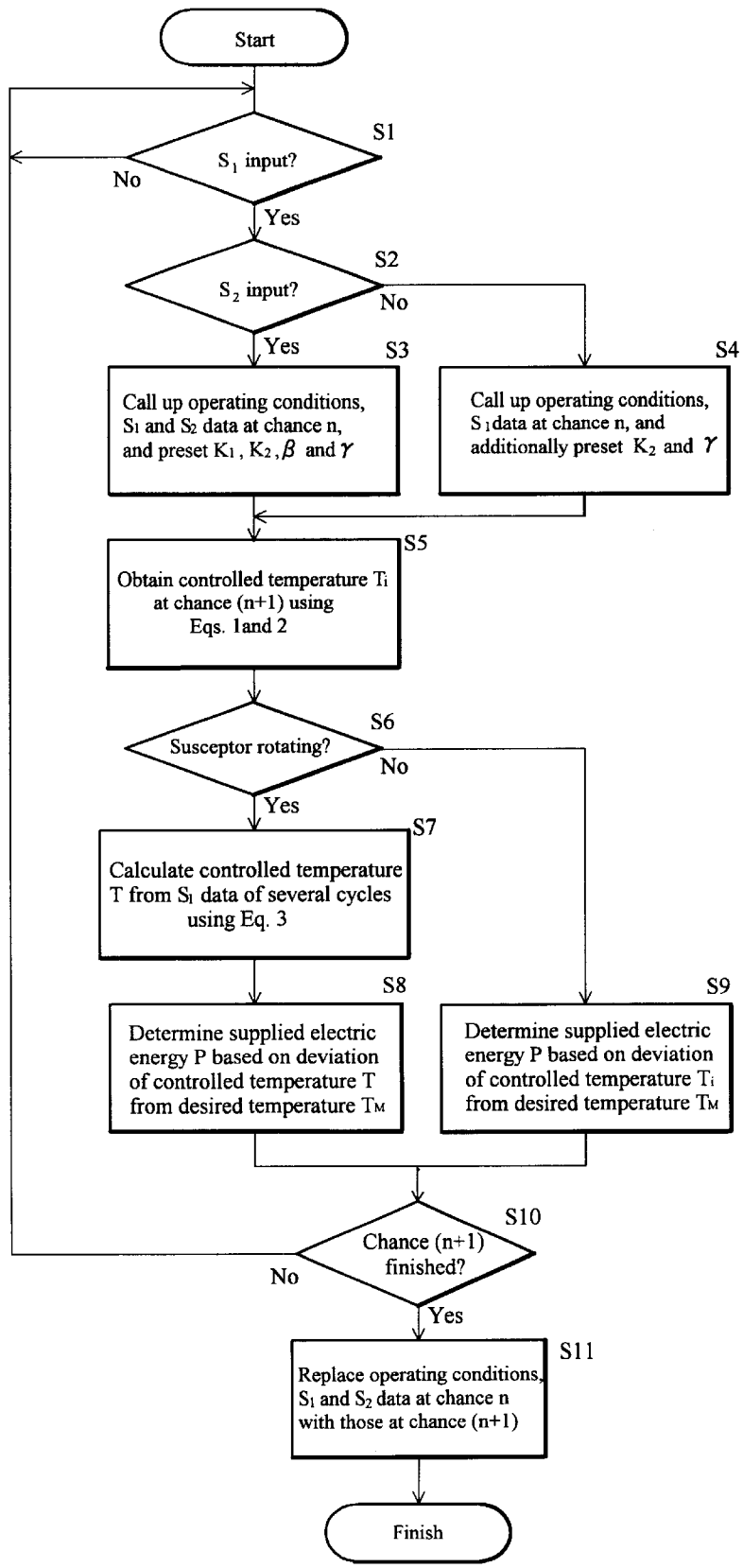
FIG. 2 is a flow chart diagrammatically showing the operation of a controlling means in the thermal processing apparatus according to the embodiment.

FIG. 2 is a flow chart diagrammatically showing the operation of the controlling means 12 shown in FIG. 1.

In Step (hereinafter, "S") 1, whether a signal $s_1$ (measured temperature $T_{mi}$) is input or not is judged. When the signal $s_1$ is judged not input, the operation goes back to the start. On the other hand, when the signal $s_1$ is judged input, whether a signal $s_2$ (measured temperature $T_p$) is input or not is judged in S2. When the signal $s_2$ is judged input, operating conditions at chance n ($\Delta T_p$, N, $T_{mi}$, P, flow rate of supplied gas 32 (FIG. 1) etc.), data of the stored signals $s_1$ and $s_2$, preset and stored factors $k_1, k_2, \beta$, and $\gamma$, and the like are called up (S3), and the operation proceeds to S5. On the other hand, when the signal $s_2$ is judged not input, operating conditions at chance n ($\Delta T_p$, N, $T_{mi}$, P, flow rate of supplied gas 32 etc.), data of the stored signal $s_1$, and additionally preset and stored factors $k_1, k_2$, and $\gamma$ (here, $k_1$0, $k_2=k_2'$, $\gamma=\gamma'$) are called up (S4), and the operation proceeds to S5.

Then, these conditions, data, factors, and the like are substituted into Equations 1 and 2 to find a controlled temperature Ti at chance (n+l) (S5), and in S6, whether a susceptor 31d (FIG. 1) is rotated or not is judged. When the susceptor 31d is judged rotated, a controlled temperature T is obtained using Equation 3 (S7). After a supplied electric energy P is obtained based on a deviation of the controlled temperature T from a desired temperature $T_M$ (S8), the operation goes to S10. On the other hand, when the susceptor 31d is judged not rotated in S6, a supplied electric energy P is obtained based on a deviation of the controlled temperature $T_i$ from the desired temperature $T_M$ (S9), and the operation goes to S10. Whether the process of the (n+1) chance is finished or not is judged in S10. When the process of the (n+1) chance is judged not finished, the operation returns to S1. On the other hand, when the process of the (n+1) chance is judged finished, the operating conditions at chance n, data of the stored signals $s_1$ and $s_2$, and the like are replaced with those at chance (n+1) (S11), and the operation is finished.

As is obvious from the above description, using the thermal processing apparatus 10 according to the embodiment, comprising the controlling means 12 which has the learning-modifying means 12a to learn and modify the output $s_1$ from the radiation thermometer 37 based on the output $s_1$ from the radiation thermometer 37, the supplied electric energy P to the heating means 34, and the output $s_2$ from the radiation thermometer 11, it is possible to accurately measure the temperature of the wafer 33 at all times even when a gas component and the like deposit on the vessel body 31a, or the infrared ray transmission performance of the vessel body 31a deteriorates. As the wafer 33 is kept at the desired temperature $T_M$, epitaxial growth processing and etching can be reliably conducted thereon. As a result, the quality of the wafer 33 as a semiconductor substrate can be improved.

Since the controlling means 12 also has the rotational component eliminating means 12b, to control so as to eliminate the sine wave component which appears in the output $s_1$ from the radiation thermometer 37 with the rotation of the wafer 33, the temperature of the wafer 33 can be accurately measured at all times and almost the same effect as described above can be obtained, even when the wafer 33 is rotated.

Since the controlling means 12 has both the learning-modifying means 12a to learn and modify the output $s_1$ from the radiation thermometer 37 based on the output $s_1$ from the radiation thermometer 37, the supplied electric energy P to the heating means 34 and the output $s_2$ from the radiation thermometer 11, and the rotational component eliminating means 12b, to control so as to eliminate the sine wave component which appears in the output $s_1$ from the radiation thermometer 37 with the rotation of the wafer 33, because of a synergistic effect of the above effects, a more excellent effect can be obtained.

Since the heating means 34 is arranged outside the vessel body 31a which transmits infrared rays and is constituted so that the wafer 33 is heated by infrared lamps 34a and 34b, the contamination of the wafer 33 caused by the heating means 34 can be reliably prevented, so that the quality of the wafer 33 after thermal processing can be secured.

Here, in the thermal processing apparatus 10 according to the embodiment, the case where a wafer 33 is used as a workpiece is described, but the workpiece is not limited to the wafer 33.

In the thermal processing apparatus 10 according to the embodiment, the case where the whole vessel body 31a is made of a material such as quartz glass which transmits infrared rays is described, but in another embodiment, at least the transmission parts 31e and 31f of the radiation lights 11a and 33a in the vessel body 31a and the vicinity of the infrared lamps 34a and 34b may be made of quartz glass or the like.

In the thermal processing apparatus 10 according to the embodiment, the case where the temperature of the bottom of the susceptor 31d is measured using the radiation thermometer 11 as a second temperature measuring means is described, but in another embodiment, a wall mounted thermometer buried within the vessel body 31a may be used.

In the thermal processing apparatus 10 according to the embodiment, the case where the radiation thermometer 11 is arranged is described, but in another embodiment, the radiation thermometer 11 need not be arranged. This case can be dealt with by the performance of S4 in the flow chart shown in FIG. 2.

In the thermal processing apparatus 10 according to the embodiment, the case where the susceptor 31d is rotatable is described, but in another embodiment, the susceptor 31d may be fixed. This case can be dealt with by the performance of S9 in the flow chart shown in FIG. 2.

EXAMPLES AND COMPARATIVE EXAMPLES

The examination results of changes in the measured temperature, supplied electric energy, and specific resistance of a wafer when epitaxial growth processing was conducted on samples using a thermal processing apparatus according to the Example are described below.

As an apparatus and a sample, a thermal processing apparatus 10 and a wafer 33 shown in FIG. 1 were used, respectively. As experimental conditions, a correction factor $\beta=1.2$, an obliteration factor $k_1=1$, an obliteration factor $k_2=0$, the amount of change in the measured temperature by a radiation thermometer 11 at one chance $\Delta T_p=4$, and a desired temperature $T_M=1125°$ C. were selected. Then, a controlled temperature $T_i$ was automatically computed by a controlling means 12 according to the below Equations 4 and 5.

$$\Delta T_a(n+1) = \Delta T_a(n) + 1 \times \{(1.2 \times 4/7) - \Delta T_a(n)\} = 0.7 \quad \text{Eq. 4}$$

$$T_i = T_{mi} + 0.7 \quad \text{Eq. 5}$$

When a susceptor 3 id was fixed, a cycle $T_p$ and an amplitude A were computed using the below Equations 6 and 7. When the threshold value of the amplitude A was below $A_{max}$, Asin $(2\pi/T_p \times t)$ was subtracted from the controlled temperature $T_i$ to obtain a controlled temperature T. Here, the time was measured from the time $t_4$ when a temperature differential value T' in FIG. 11 was zero, and the phase was obtained by $t_4 + Tp/4$.

$$Tp = \{(t_3-t_1) + (t_4-t_2)\}/2 \quad \text{Eq. 6}$$

where, Tp: cycle
$t_1, t_2, t_3, t_4$: time when temperature differential value T' in FIG. 11 is zero $$A = \{(T_A-T_B) + (T_C-T_D)\}/4$$

where, A: amplitude
$T_A, T_B, T_C, T_D$: highest or lowest temperature in sine wave of FIG. 11

As a Comparative Example, the case where a controlling means 12 (FIG. 1) was not operated, using a thermal processing apparatus 10, or the case where a conventional thermal processing apparatus 30 shown in FIG. 7 was used, was selected.

Figure 3:
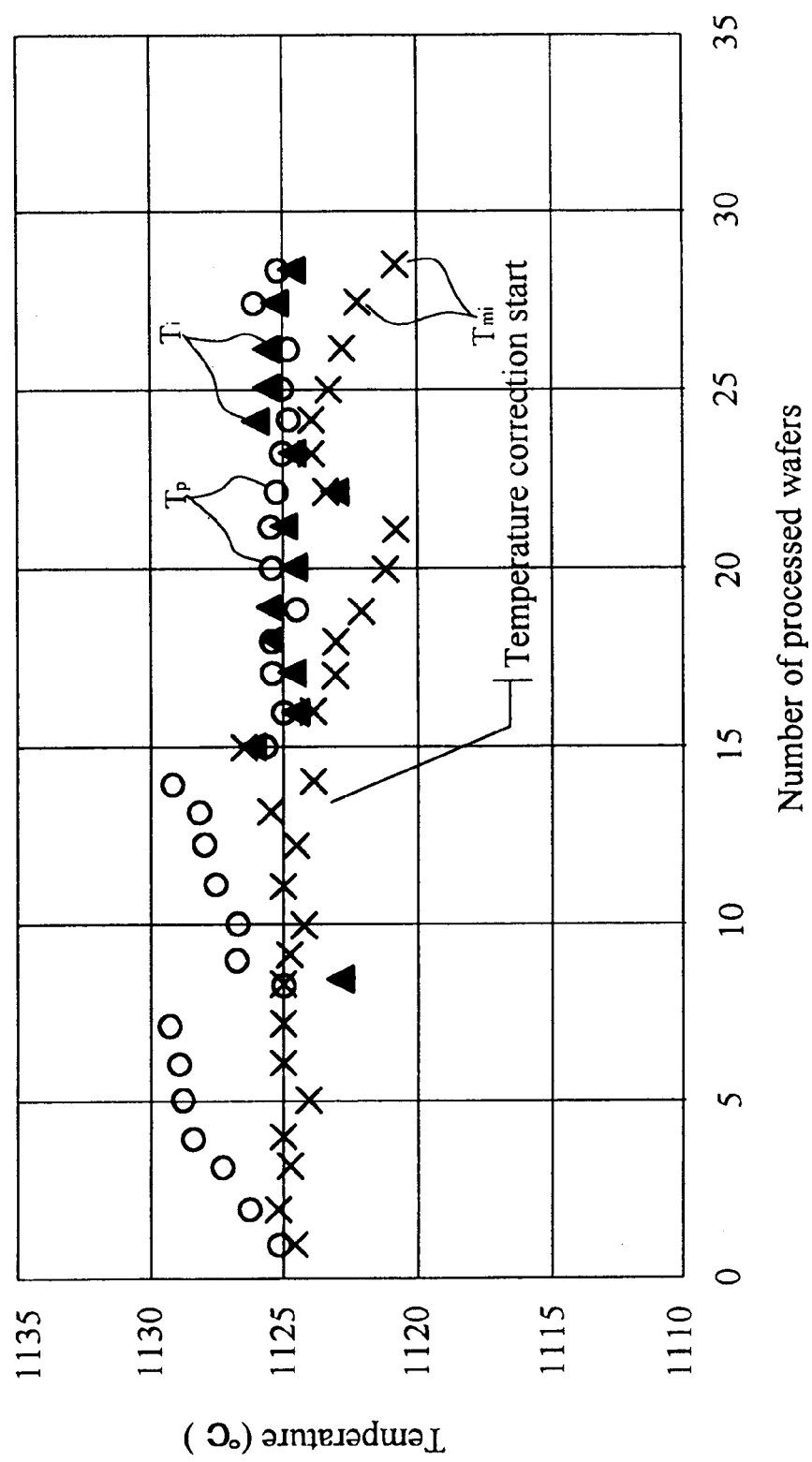
FIG. 3 is a graph indicating the relationship between the temperature and the number of processed wafers in the case where a controlling means is not operated, or operated, using a thermal processing apparatus according to an example (a susceptor is fixed), and in the figure, X shows a measured temperature of the top of the wafer measured using a first radiation thermometer, ○ shows a measured temperature of the bottom of a susceptor measured using a second radiation thermometer, and ▲ shows a controlled temperature in the case where the controlling means is operated.
Figure 4:
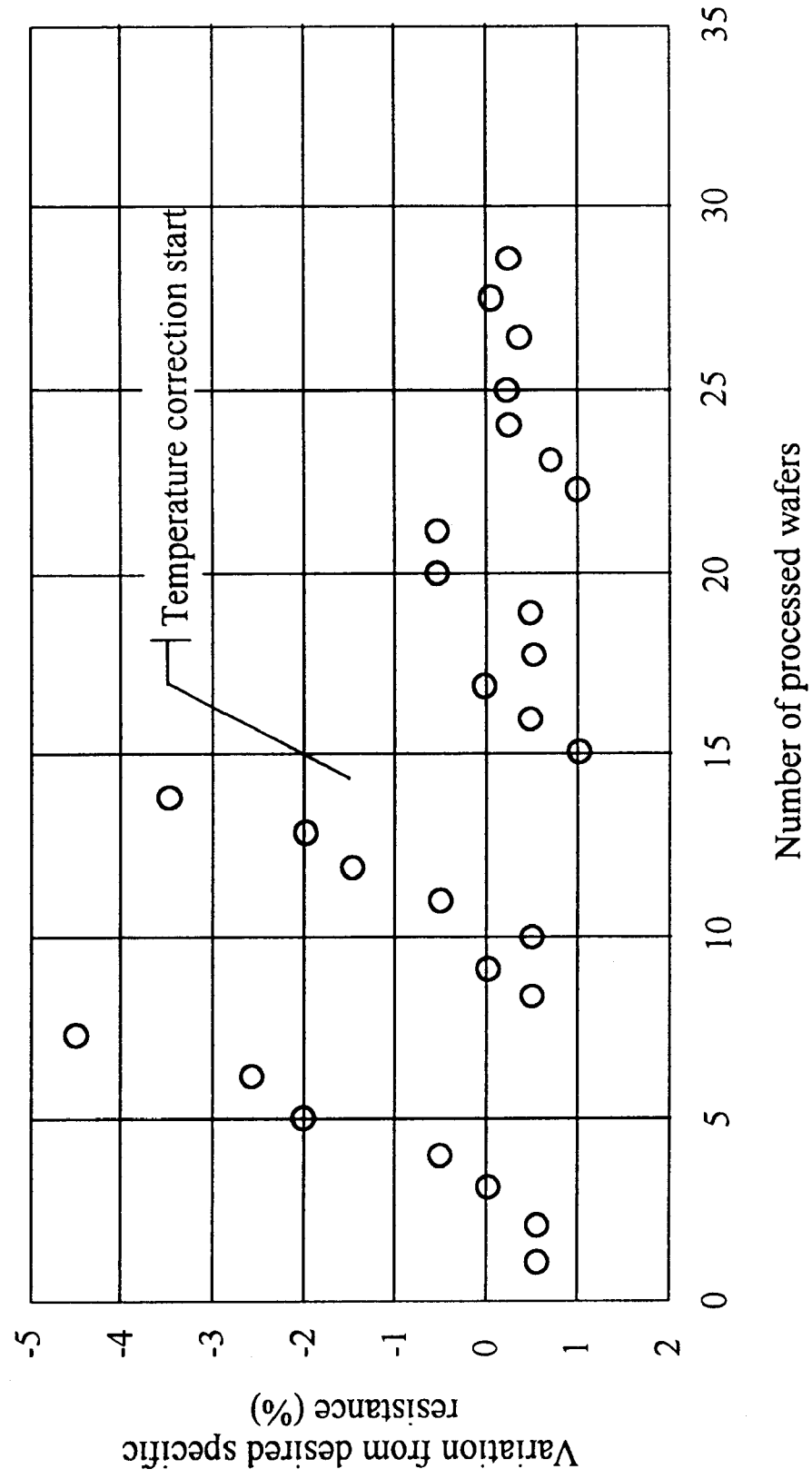
FIG. 4 is a graph indicating variations in specific resistance of each wafer in the case where the controlling means shown in FIG. 3 is operated, or not operated.

FIG. 3 is a graph indicating the comparison of the relationship between the temperature and the number of processed wafers 33 in the case where the controlling means 12 was operated, with that in the case where the controlling means 12 was not operated, using a thermal processing apparatus 10 according to the Example (a susceptor 31d was fixed). In the figure, X shows a measured temperature $T_{mi}$ of the top of the wafer 33 measured using a radiation thermometer 37, ○ shows a measured temperature $T_p$ of the bottom of the susceptor 31d measured using a radiation thermometer 11, and ▲ shows a controlled temperature $T_i$ in the case where the controlling means 12 (all in FIG. 1) was operated. FIG. 4 is a graph indicating the specific resistance of each wafer in the case where the controlling means shown in FIG. 3 was operated, and in the case where the controlling means was not operated.

As is obvious from FIGS. 3 and 4, in the case of the apparatus according to the Example wherein the controlling means 12 was operated (the number of processed wafers was between 15 and 28), the measured temperature $T_{mi}$ of the wafer sloped down and to the right in each chance, but the controlled temperature $T_i$ obtained by correcting the decline of the measured temperature $T_m$ was approximate to the desired temperature $T_M$ and the ratio of shift toward the minus side of the specific resistance became smaller. On the other hand, in the case of the apparatus according to the Comparative Example wherein the controlling means 12 was not operated (the number of processed wafers was between 1 and 14), the measured temperature $T_m$ of the wafer was approximate to the desired temperature $T_M$, but the measured temperature $T_p$ of the bottom of the susceptor which was close to the actual temperature sloped up and to the right in each chance so as to be over the desired temperature $T_M$, and the ratio of shift toward the minus side of the specific resistance became larger.

Figure 5A:
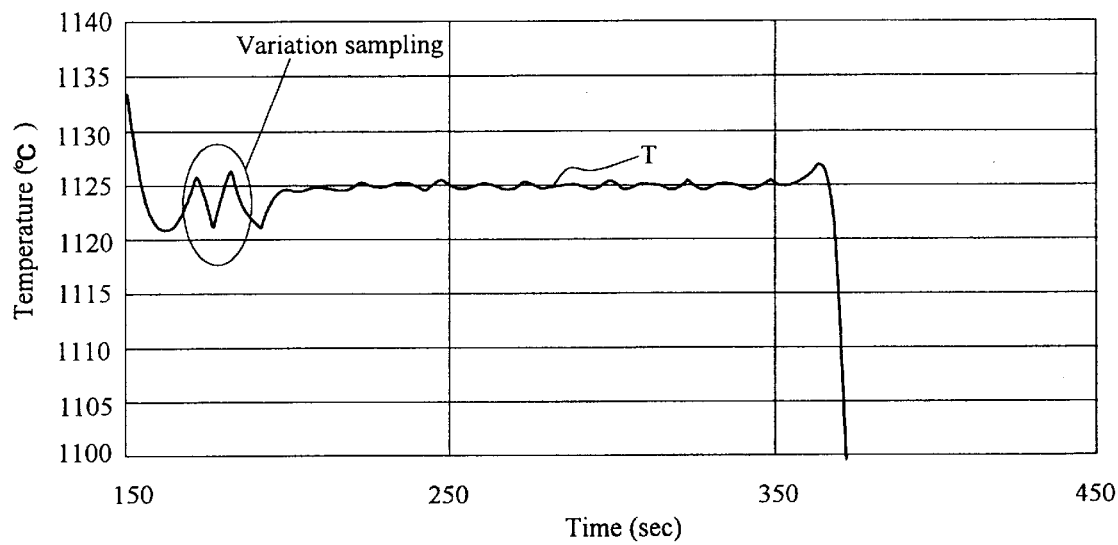
FIGS. 5(a) and 5(b) are graphs indicating changes in temperature and supplied electric energy, respectively, in the case where epitaxial growth processing is conducted on a wafer using a thermal processing apparatus according to the example (a susceptor is rotated)
Figure 5B:
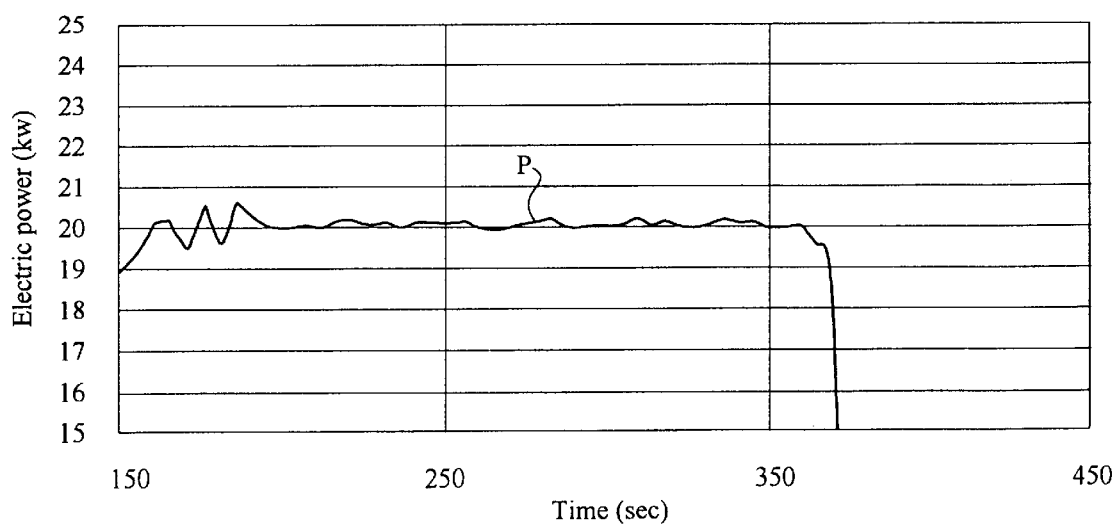
Figure 6A:
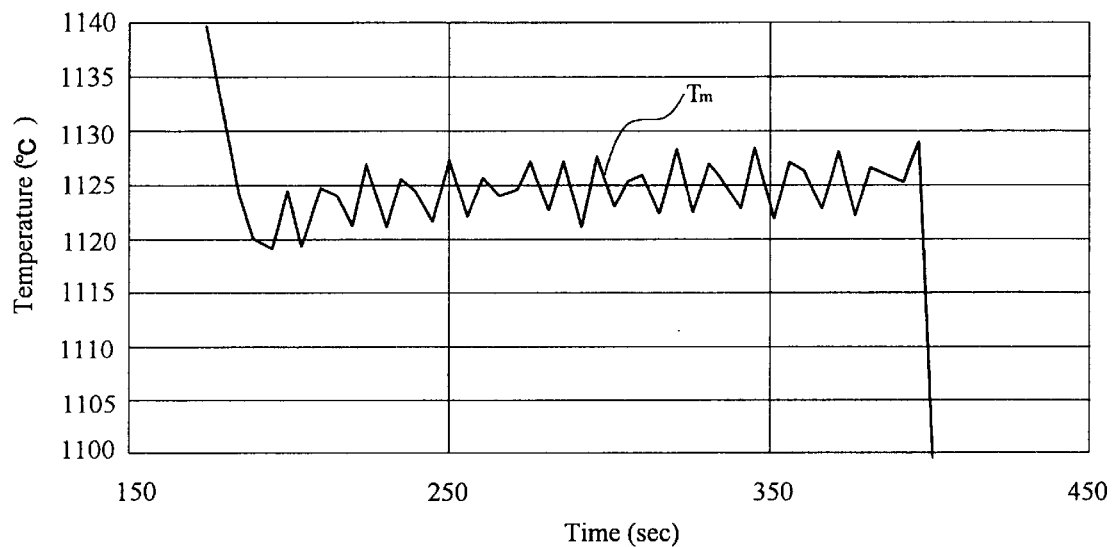
FIGS. 6(a) and 6(b) are graphs indicating changes in temperature and supplied electric energy, respectively, in the case where epitaxial growth processing is conducted on a wafer using a thermal processing apparatus according to a comparative example (a susceptor is rotated)
Figure 6B:
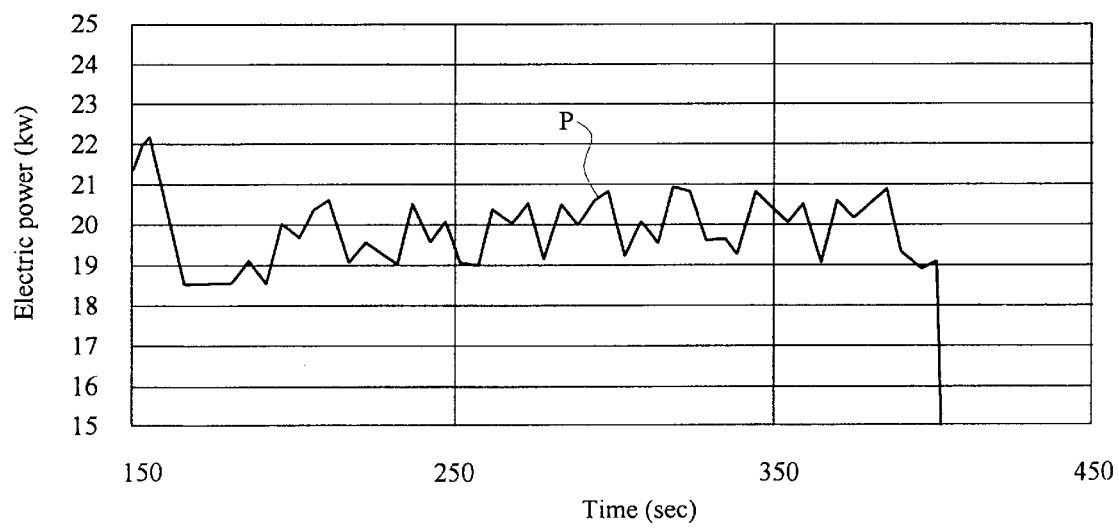

FIGS. 5(a) and 5(b) are graphs indicating changes in temperature and supplied electric energy, respectively, in the case where epitaxial growth processing was conducted on a wafer using a thermal processing apparatus 10 according to the Example (FIG. 1, a susceptor was rotated). FIGS. 6(a) and 6(b) are graphs indicating changes in temperature and supplied electric energy, respectively, in the case where epitaxial growth processing was conducted on a wafer using a thermal processing apparatus 30 according to the Comparative Example (FIG. 7, a susceptor was rotated).

As is obvious from FIG. 5, in the case of the apparatus according to the Example, after sampling the amount of variation, the controlled temperature T was less influenced by the degree of horizontality in supporting a wafer and the fluctuation of the supplied electric energy P was small. On the other hand, as is obvious from FIG. 6, in the case of the apparatus according to the Comparative Example, the measured temperature $T_m$ was more influenced by the degree of horizontality in supporting a wafer and the fluctuation of the supplied electric energy P was large.

As is obvious from the above results, using the thermal processing apparatus 10 according to the Example, the temperature of a wafer 33 can be accurately measured at all times, and as the wafer 33 is kept at a desired temperature $T_M$, epitaxial growth processing can be conducted thereon. As a result, variations in specific resistance of each wafer 33 can be reduced.

What is claimed is:

1. A thermal processing apparatus, comprising:
   a heating means;
   a power supply means to supply electric power to said heating means;
   a controlling means to control supplied electric energy to said heating means; and
   a first temperature measuring means to measure the temperature of a workpiece through a member which transmits infrared rays, said first temperature measuring means having an output corresponding to a measured temperature of the workpiece;
   wherein said controlling means comprises a learning-modifying means for learning the output from said first temperature measuring means and modifying the output from said first temperature measuring means to more accurately correspond to the actual temperature of the workpiece based on at least one of the output from said first temperature measuring means, a supplied electric energy to said heating means and an output from a second temperature measuring means separate from said first temperature measuring means.

2. The thermal processing apparatus of claim 1, wherein said heating means is outside the member which transmits infrared rays and is constituted so as to heat the workpiece using infrared rays.

3. A thermal processing apparatus, comprising:
   a heating means;
   a power supply means to supply electric power to said heating means;
   a controlling means to control supplied electric energy to said heating means; and
   a first temperature measuring means to measure the temperature of a workpiece through a member which transmits infrared rays, said first temperature measuring means having an output corresponding to a measured temperature of the workpiece;
   wherein said controlling means comprises a rotational component eliminating means for controlling by eliminating a periodically fluctuating signal component which appears in the output from said first temperature measuring means with rotation of the workpiece.

4. The thermal processing apparatus of claim 3, wherein said heating means is outside the member which transmits infrared rays and is constituted so as to heat the workpiece using infrared rays.

5. A thermal processing apparatus, comprising:
   a heating means;
   a power supply means to supply electric power to said heating means;
   a controlling means to control supplied electric energy to said heating means; and
   a first temperature measuring means to measure the temperature of a workpiece through a member which transmits infrared rays, said first temperature measuring means having an output corresponding to a measured temperature of the workpiece;
   wherein said controlling means comprises both a learning-modifying means for learning the output from said first temperature measuring means and modifying the output from said first temperature measuring means to more accurately correspond to the actual temperature of the workpiece based on at least one of the output from said first temperature measuring means, a supplied electric energy to said heating means and an output from a second temperature measuring means separate from said first temperature measuring means, and a rotational component eliminating means for controlling by eliminating a periodically fluctuating signal component which appears in the output from said first temperature measuring means with rotation of the workpiece.

6. The thermal processing apparatus of claim 5, wherein said heating means is outside the member which transmits infrared rays and is constituted so as to heat the workpiece using infrared rays.

7. A thermal processing apparatus, comprising:
   a member which transmits infrared rays;
   a heating system for heating a workpiece to be processed;
   a power supply to supply electric power to said heating system;
   a first radiation thermometer to measure the temperature of the workpiece through said member which transmits infrared rays; and
   a controlling means for controlling electric energy supplied to said heating system by said power supply, said controlling means comprising at least one of:
      a learning-modifying means for learning the output from said first radiation thermometer and modifying the output from said first radiation thermometer to more accurately correspond to the actual temperature of the workpiece based on at least one of the output from said first radiation thermometer, the electric energy supplied to said heating system and an output from a second radiation thermometer separate from said first radiation thermometer, and
      a rotational component eliminating means for controlling by eliminating a periodically fluctuating signal component which appears in the output from said first temperature measuring means with rotation of the workpiece.

8. The thermal processing apparatus of claim 7, wherein said controlling means comprises said learning-modifying means, and said learning-modifying means modifies the output from said first radiation thermometer to more accurately correspond to the actual temperature of the workpiece based on at least the output from said first radiation thermometer and the electric energy supplied to said heating system.

9. The thermal processing apparatus of claim 8, wherein said member is positioned between the workpiece and said heating system.

10. The thermal processing apparatus of claim 7, wherein said controlling means comprises said learning-modifying means, and said learning-modifying means modifies the output from said first radiation thermometer to more accurately correspond to the actual temperature of the workpiece based on at least the output from said first radiation thermometer, the electric energy supplied to said heating system and an output from a second radiation thermometer separate from said first radiation thermometer.

11. The thermal processing apparatus of claim 10, wherein said member is positioned between the workpiece and said heating system.

12. The thermal processing apparatus of claim 10, wherein said member is positioned between the workpiece and said second radiation thermometer.

* * * * *